(12) United States Patent
Mort et al.

(10) Patent No.: US 7,667,482 B2
(45) Date of Patent: Feb. 23, 2010

(54) INDUCTIVELY POWERED POWER BUS APPARATUS

(75) Inventors: Deborah K. Mort, Coraopolis, PA (US); Carlos H. Rentel, Sussex, WI (US); Brian Thomas Pier, Milwaukee, WI (US)

(73) Assignee: Eaton Corporation, Cleveland, OH (US)

( * ) Notice: Subject to any disclaimer, the term of this patent is extended or adjusted under 35 U.S.C. 154(b) by 95 days.

(21) Appl. No.: 11/859,366

(22) Filed: Sep. 21, 2007

(65) Prior Publication Data

US 2009/0079417 A1 Mar. 26, 2009

(51) Int. Cl.
*G01R 31/36* (2006.01)
*G01R 31/00* (2006.01)

(52) U.S. Cl. .................... 324/771; 324/508; 324/103 R; 324/117 R

(58) Field of Classification Search ................. 324/771, 324/508, 103 R, 117, 117 R
See application file for complete search history.

(56) References Cited

U.S. PATENT DOCUMENTS

| | | | |
|---|---|---|---|
| 4,587,509 A | 5/1986 | Pitt et al. | |
| 4,616,207 A | 10/1986 | Knapp, Jr. et al. | |
| 4,855,671 A | 8/1989 | Fernandes | |
| 5,181,026 A * | 1/1993 | Granville | 340/870.28 |
| 5,349,162 A | 9/1994 | Holling | |
| 5,565,783 A | 10/1996 | Lau et al. | |
| 6,043,461 A | 3/2000 | Holling et al. | |
| 6,084,522 A | 7/2000 | Addy | |
| 6,087,800 A | 7/2000 | Becker et al. | |
| 6,130,599 A | 10/2000 | Juds et al. | |
| 6,271,656 B1 | 8/2001 | Juds et al. | |
| 6,628,496 B2 | 9/2003 | Montjean | |
| 6,642,704 B2 | 11/2003 | Hastings et al. | |
| 6,731,105 B1 | 5/2004 | Hoyle et al. | |
| 7,015,716 B2 * | 3/2006 | Chen et al. | 324/771 |
| 7,053,601 B1 | 5/2006 | Fenske et al. | |
| 7,145,322 B2 | 12/2006 | Solveson et al. | |
| 7,408,475 B2 * | 8/2008 | Sugama et al. | 340/663 |
| 2006/0076946 A1 | 4/2006 | Shvach et al. | |
| 2007/0007968 A1 | 1/2007 | Mauney, Jr. et al. | |
| 2007/0075728 A1 * | 4/2007 | Chang et al. | 324/771 |

OTHER PUBLICATIONS

National Semiconductor Corporation, "LM35 Precision Centigrade Temperature Sensors", Nov. 2000, pp. 1-13.

* cited by examiner

*Primary Examiner*—Ha Tran T Nguyen
*Assistant Examiner*—Emily Y Chan
(74) *Attorney, Agent, or Firm*—Martin J. Moran

(57) ABSTRACT

An apparatus for a power bus includes an inductive power harvesting unit structured to provide a first power output arising from current flowing in the power bus, an energy storage unit structured to store energy from the first power output and to provide a second power output, and a selector structured to select one of the first and second power outputs and to provide a third power output from the selected one. A processor is powered from the third power output of the selector. The selector is further structured to normally provide the third power output from the first power output of the inductive power harvesting unit. The processor is structured to determine that the first power output of the inductive power harvesting unit is inadequate and to cause the selector to provide the third power output from the second power output of the energy storage unit.

21 Claims, 2 Drawing Sheets

INDUCTIVELY POWERED POWER BUS APPARATUS

This invention was made with Government support under DOE Cooperative Agreement No. DE-FC26-04NT42071 awarded by DOE. The Government has certain rights in this invention.

BACKGROUND OF THE INVENTION

1. Field of the Invention

This invention pertains generally to power bus apparatus and, more particularly, to apparatus, such as sensors, powered from a power bus.

2. Background Information

Electrical sensors of various types are used to detect the current flowing through a conductor. Such sensors include, for example, a single Hall effect sensor that produces an output voltage indicative of the current magnitude as well as more conventional current sensors such as a shunt resistor.

Hall effect devices have been used to sense variations in magnetic flux resulting from a flow of current through a conductor. Some of these known devices have used a flux concentrator to concentrate magnetic flux emanating from the flow of current through the conductor. It has previously been suggested that electrical current sensing apparatus could be constructed in the manner disclosed in U.S. Pat. Nos. 4,587,509; and 4,616,207.

It is also known to measure the current in a conductor with one or two appropriately placed Hall sensors that measure flux density near the conductor and to convert the same to a signal proportional to current. See, for example, U.S. Pat. Nos. 6,130,599; 6,271,656; 6,642,704; and 6,731,105.

U.S. Pat. No. 7,145,322 discloses a power bus current sensor, which is powered by a self-powered inductive coupling circuit. Sensors sense current or temperature of the power bus. A microprocessor inputs the sensed current and the sensed temperature from the sensors and outputs corresponding signals to a radio transceiver circuit. A power supply employs voltage produced by magnetically coupling the power bus to one or more coils, in order to power the sensors, the radio transceiver circuit and the microprocessor from flux arising from current flowing in the power bus. Suitable power management routines are employed to help save power consumption by putting the microprocessor into a sleep (e.g., low-power) mode and waking up when data is to be sent. Peak power is supplied by capacitors in the power supply during relatively short durations of transmission or reception. Otherwise, the radio transceiver circuit is preferably turned off.

U.S. Patent Application Pub. No. 2007/0007968 discloses a system for monitoring an electrical power system including one or more transducer units, each of which has a current measuring device and a voltage measuring device coupled to a respective one of the phase conductors of the power system, and a transducer wireless communications device. The transducer unit includes a battery for providing power to the components thereof. The battery is connected to a trickle charger, which, in turn, is electrically coupled to a phase conductor. The trickle charger is a known parasitic power charger that draws power from the phase conductor and uses it to charge the battery.

There is room for improvement in sensors and other apparatus for power busses.

SUMMARY OF THE INVENTION

These needs and others are met by embodiments of the invention, which provide an inductive power harvesting unit, an energy storage unit and a selector, which normally selects power from the inductive power harvesting unit, and which detects loss of power from the inductive power harvesting unit and responsively selects power from the energy storage unit.

In accordance with one aspect of the invention, an apparatus for a power bus including a current flowing therein comprises: an inductive power harvesting unit structured to provide a first power output arising from the current flowing in the power bus; an energy storage unit structured to store energy from the first power output of the inductive power harvesting unit and to provide a second power output; a selector structured to select one of the first power output of the inductive power harvesting unit and the second power output of the energy storage unit and to provide a third power output from the selected one; and a processor powered from the third power output of the selector, wherein the selector is further structured to normally provide the third power output from the first power output of the inductive power harvesting unit, and wherein the processor is structured to determine that the first power output of the inductive power harvesting unit is inadequate and to cause the selector to provide the third power output from the second power output of the energy storage unit.

As another aspect of the invention, an apparatus is for a power bus including a current flowing therein and a characteristic. The apparatus comprises: a sensor structured to sense the characteristic of the power bus; an inductive power harvesting unit structured to provide a first power output arising from the current flowing in the power bus; an energy storage unit structured to store energy from the first power output of the inductive power harvesting unit and to provide a second power output; a selector structured to select one of the first power output of the inductive power harvesting unit and the second power output of the energy storage unit and to provide a third power output from the selected one; a processor powered from the third power output of the selector; and a wireless transceiver powered from the third power output of the selector, cooperating with the processor, and structured to output a wireless message including or related to the sensed characteristic of the power bus, wherein the selector is further structured to normally provide the third power output from the first power output of the inductive power harvesting unit, and wherein the processor is structured to determine that the first power output of the inductive power harvesting unit is inadequate and to cause the selector to provide the third power output from the second power output of the energy storage unit.

The processor may be further structured to determine that the second power output of the energy storage unit is inadequate and responsively cause the wireless transceiver to send a predetermined number of wireless messages in anticipation of loss of power from the second power output of the energy storage unit before going to sleep.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
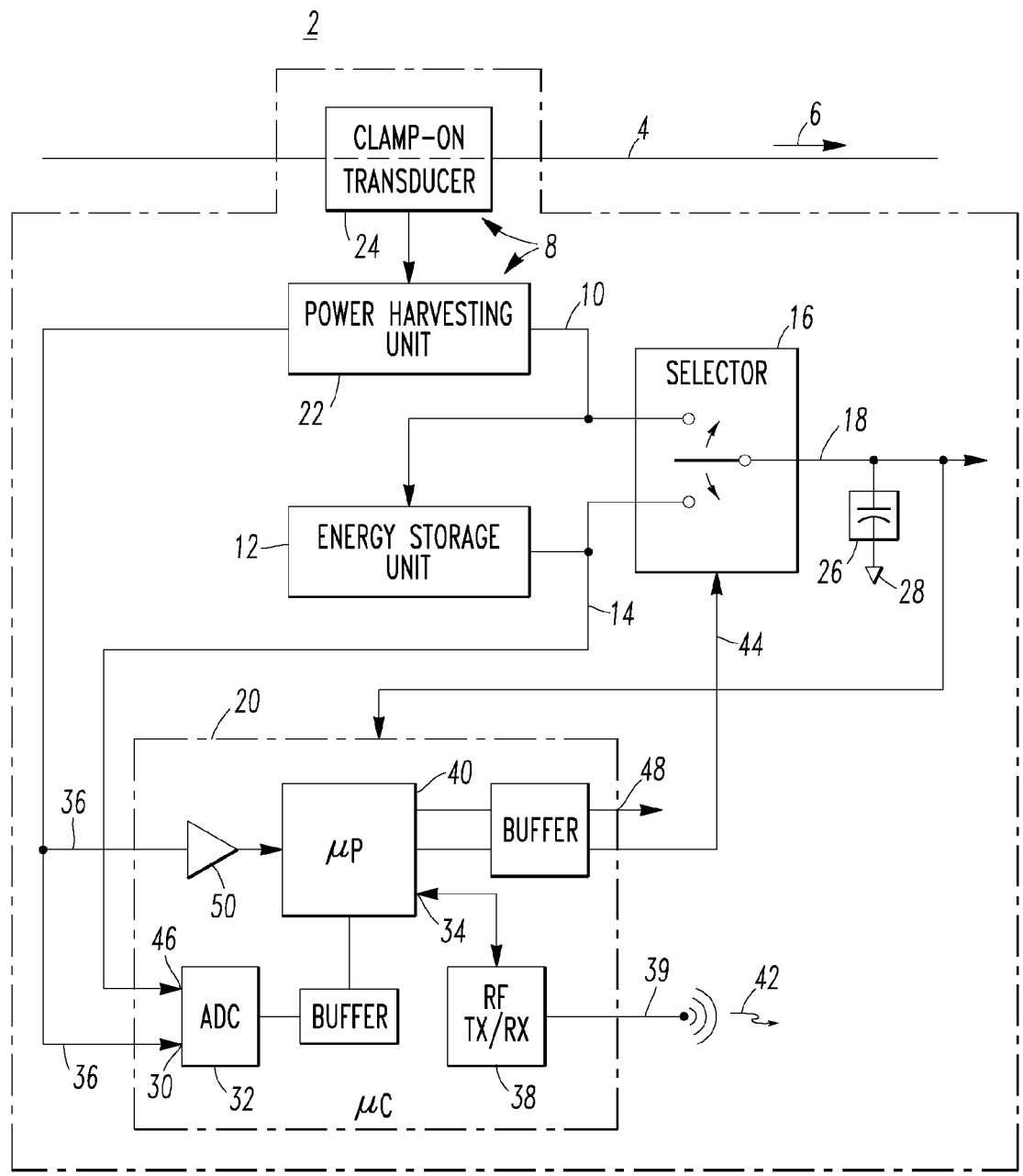
FIG. 1 is a block diagram in schematic form of an apparatus for a power bus.

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein the term "antenna" shall expressly include, but not be limited by, any structure adapted to radiate and/or to receive electromagnetic waves, such as, for example, radio frequency signals.

As employed herein the term "switchgear device" shall expressly include, but not be limited by, a circuit interrupter, such as a circuit breaker (e.g., without limitation, low-voltage or medium-voltage or high-voltage); a motor controller/starter; and/or any suitable device which carries or transfers current from one place to another.

As employed herein the term "power bus" means a power conductor; a power bus bar; a power line; a power phase conductor; a power cable; and/or a power bus structure for a power source, a circuit interrupter or other switchgear device, or a load powered from the power bus.

As employed herein, the term "wireless" means without a wire, without an electrical conductor and without an optical fiber or waveguide, radio frequency (RF), light, visible light, infrared, ultrasound, wireless area networks, such as, but not limited to, IEEE 802.11 and all its variants (e.g., without limitation, 802.11a; 802.11b; 802.11g), IEEE 802.15 and all its variants (e.g., without limitation, 802.15.1; 802.15.3, 802.15.4), IEEE 802.16 and all its variants, IEEE 802.22 and all its variants, other wireless communication standards (e.g., without limitation, ZigBee™ Alliance standard), HyperLan, DECT, PWT, pager, PCS, Wi-Fi, Bluetooth™, and/or cellular.

As employed herein, the term "wireless signal" means a radio frequency signal, an infrared signal, another suitable visible or invisible light signal, or an ultrasound signal that is transmitted and/or received without a wire, without an electrical conductor and without an optical fiber or waveguide.

As employed herein, the terms "capacitor" or "supercap" or "supercapacitor" or "ultracapacitor" means a device typically consisting of conducting plates separated by thin layers of dielectric material. The plates on opposite sides of the dielectric material are oppositely charged and the electrical energy of the charged system is stored in the polarized dielectric.

As employed herein, the terms "battery" or "storage battery" mean a cell or an electrically connected group of cells that converts chemical energy into electrical charge or energy by reversible chemical reactions and that may be recharged by passing a current through it in the direction opposite to that of its discharge.

As employed herein, the term "inductive power harvesting unit" means a unit that is self-powered from an inductive field generated by current flowing in a power bus, or a battery charger or power supply that is inductively coupled to a power bus including current flowing therein.

As employed herein, the term "energy storage unit" means battery, storage battery, capacitor, supercap, supercapacitor, ultracapacitor and/or other suitable devices for storing electrical charge. If, for example, the energy storage unit is a capacitor or variation thereof, then there is an input diode to that capacitor that prevents discharge of the capacitor back to the power harvesting unit. Such an input diode needs to be electrically connected when using energy from the capacitor, but need not necessarily be employed during the charging of the capacitor. In other words, the power harvesting unit may be directly electrically connected to the capacitor when it is being charged.

As employed herein, the term "characteristic" means a characteristic of a power bus, such as, for example and without limitation, bus temperature, bus voltage, bus current flow, and bus power flow.

The invention is described in association with a current sensor for a power bus bar, although the invention is applicable to a wide range of power bus apparatus.

Referring to FIG. 1, an apparatus 2 is for a power bus 4 including a current 6 flowing therein. The apparatus 2 includes an inductive power harvesting unit 8 structured to provide a first power output 10 arising from the current 6 flowing in the power bus 4, an energy storage unit 12 structured to store energy from the first power output 10 and to provide a second power output 14, and a selector 16 structured to select one of the first power output 10 and the second power output 14 and to provide a third power output 18 from the selected one. A processor, such as the example microcomputer (µC) 20 is powered from the third power output 18 of the selector 16. The selector 16 is further structured to normally provide the third power output 18 from the first power output 10 of the inductive power harvesting unit 8. The example µC 20 is structured to determine that the first power output 10 of the inductive power harvesting unit 8 is inadequate when, for example, the output voltage thereof has dropped below a minimum threshold of the voltage required by the µC (e.g., without limitation, an ATMEL 128 requires a minimum power supply voltage of 2.7 VDC, which could be the threshold for switching by the selector 16) and to cause the selector 16 to provide the third power output 18 from the second power output 14 of the energy storage unit 12.

The example inductive power harvesting unit 8 includes a suitable power harvesting unit 22, which collects power from the power bus 4 through a suitable current transducer, such as the example clamp-on transducer 24. A non-limiting example of a clamp-on transducer is disclosed in U.S. Pat. No. 7,145,322, which is incorporated by reference herein. Alternatively, any suitable current transformer, Rogowski coil, split-core current sensor or other suitable current transducer may be employed. In turn, energy from that collected power is stored in the energy storage unit 12.

Example 1

The selector 16 preferably includes a suitable transient suppressor 26 electrically connected between the third power output 18 and ground 28.

Example 2

The µC 20 includes a current sensor 30 formed by analog-to-digital converter (ADC) 32, which is structured to sense the current 6 flowing in the power bus 4, and an output 34 structured to output the sensed current. In this instance, the power harvesting unit 22 provides a signal 36 to the ADC 32, which signal indicates the strength of the power bus current 6.

Alternatively, the signal 36 may originate from the clamp-on transducer 24 or other suitable current transducer, or from the first power output 10.

Example 3

The μC 20 preferably includes a suitable wireless transceiver 38 (e.g., radio frequency (RF) TX/RX), which is also powered from the third power output 18 of the selector 16. The RF TX/RX 38 includes a suitable antenna 39, as shown.

Example 4

In this example, the power harvesting unit 22 outputs the signal 36 that indicates that the first power output 10 of the inductive power harvesting unit 8 is inadequate. The μC ADC 32 receives the signal 36 and converts the same to a digital value for a microprocessor (μP) 40, which causes the wireless transceiver 38 to output a wireless message 42 including that signal.

Example 5

The wireless transceiver 38 may cooperate with the μP 40 to output a wireless message, such as 42, including or related to any sensed characteristic of the power bus 4. For example, the wireless message 42 may be an alarm message, which indicates that the current 6 flowing in the power bus 4 is too great and/or too small. Also, the wireless message 42 may include other sensed characteristics (e.g., without limitation, current; temperature; voltage; and/or power flow) of the power bus 4.

Example 6

Whenever the signal 36 from the power harvesting unit 22 indicates sufficient strength of the power bus current 6, the μC 20 signals the selector 16 through signal 44 to receive power from the power harvesting unit 22, which also continues to charge the energy storage unit 12. This permits the energy storage unit 12 to either maintain a maximum charge, or else to continue to be charged from less than a maximum charge to its maximum charge by the power harvesting unit 22.

If, however, the signal 36 indicates insufficient strength of the power bus current 6, then the μC 20 signals the selector 16 through the signal 44 to receive power from the energy storage unit 12. Then, the μC 20 takes whatever action is needed to either conserve power (e.g., go to sleep) and/or send a suitable number of final wireless message(s) 42 (only one wireless message 42 is shown in FIG. 1) in anticipation of loss of power from the energy storage unit 12 (e.g., after detecting an insufficient level of remaining energy in this energy storage unit via any suitable electronic mechanism, such as another example ADC input channel 46). The μC 20 wakes up when the signal 36 indicates sufficient strength of the power bus current 6, and then signals the selector 16 through the signal 44 to receive power from the power harvesting unit 22.

Example 7

The selector 16 may be autonomous, may be controlled by the μC 20, or may be controlled by a separate circuit (not shown).

Example 8

The disclosed apparatus 2 is self-powered from the inductive field generated by the power bus 4. The harvested power from the power harvesting unit 22 is used to continuously charge the energy storage unit 12.

Example 9

The energy storage unit 12 may be, for example, a suitable capacitor, a supercapacitor, an ultracapacitor, another suitable device for storing electrical charge, or a suitable electronic circuit that charges a rechargeable battery.

Example 10

The disclosed apparatus 2 can operate for relatively longer periods of time compared to known prior devices based upon: (1) harvesting power by the power harvesting unit 22; (2) storing energy from the harvested power in the energy storage unit 12 without interruption of operations of the apparatus 2; (3) selecting the energy storage unit 12 to provide the stored energy for power when the harvested power is insufficient; and (4) modifying its operational behavior to save energy in case power is derived solely from that stored energy.

For example, the μC 20 includes an output 48. The energy storage unit 12 is structured to provide the second power output 14 to power the μC 20 through the selector 16 for at least a period of time sufficient for the μP 40 to output an alarm at the output 48.

As another example, the μP 40 is structured to determine that the second power output 14 of the energy storage unit 12 is inadequate through the ADC channel 46 and to responsively send a predetermined number (e.g., one or more) of the wireless messages 42 from the wireless transceiver 38 in anticipation of loss of that power from the selector 16.

As another example, the μP 40 is structured to determine that the second power output 14 of the energy storage unit 12 is inadequate through the ADC channel 46 and to responsively go to sleep. Preferably, before this is done, the μP 40 causes a predetermined number of the wireless messages 42 to be sent from the wireless transceiver 38.

As a further example, the μP 40 is structured to wake up responsive to the first power output 10 of the inductive power harvesting unit 22 being adequate as determined from the signal 36 through a comparator 50, the output of which causes the μP 40 to wake up. In turn, the μP 40 signals the selector 16 through the signal 44 to receive power from the first power output 10 of the inductive power harvesting unit 8.

Example 11

The current transducer 24 may sense the current 6 flowing in the power bus 4 and provide a corresponding signal (not shown) directly to the μC 20 or through suitable signal conditioning by the power harvesting unit 22, which outputs the signal 36. The μC 20 may process the signal, such as 36, locally, may locally alarm that signal (e.g., through output 48), or may wirelessly transmit that signal and/or alarm to a remote location through the wireless message 42.

Example 12

The disclosed apparatus 2 can sense a number of characteristics of the power bus 4 (e.g., measure and/or detect the current 6 in the power bus 4) and wirelessly transmit through the wireless message 42 a number of such sensed characteristics to another wirelessly enable device (not shown) or as part of a wireless communication network (e.g., without limitation, ZigBee™ Alliance standard).

Example 13

Figure 2:
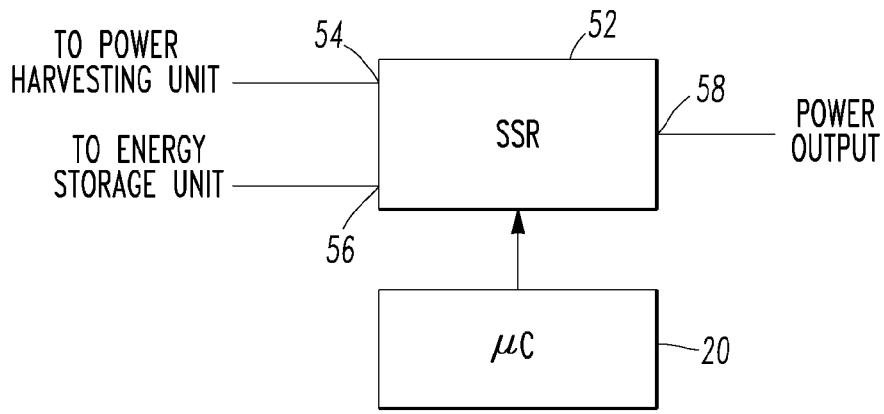
FIGS. 2-4 are block diagrams in schematic form showing the selector of FIG. 1 in accordance with other embodiments of the invention.

The selector 16 may be, for example, an electronic relay (e.g., without limitation, a suitable two pole, single throw solid state relay (SSR) 52 with a common output configuration) as shown in FIG. 2. For example, the power harvesting unit 22 (FIG. 1) is electrically connected to the transient suppressor 26 through the normally closed pole 54 of the SSR 52, and the energy storage unit 12 (FIG. 1) is electrically connected to the transient suppressor 26 through the normally open pole 56 of the SSR 52. A common output 58 outputs the third power output 18 from the selected one of the units 22,12.

Example 14

Figure 3:
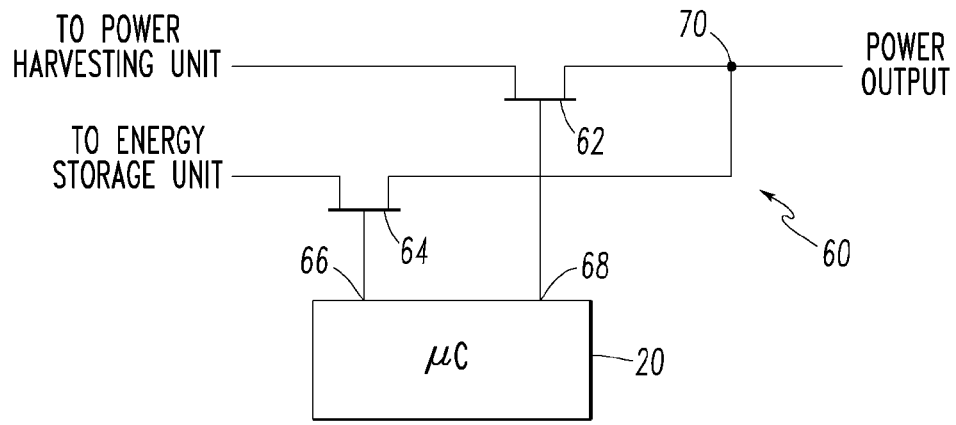

The selector 16 may be, for example, an electronic relay 60 (e.g., without limitation, two FETs 62,64 controlled in parallel by two μC outputs 66,68, respectively) as shown in FIG. 3. For example, the power harvesting unit 22 (FIG. 1) is electrically connected to the transient suppressor 26 (FIG. 1) through the FET 62, and the energy storage unit 12 (FIG. 1) is electrically connected to the transient suppressor 26 through the other FET 64. The FETs 62,64 include a common output 70.

Example 15

Figure 4:
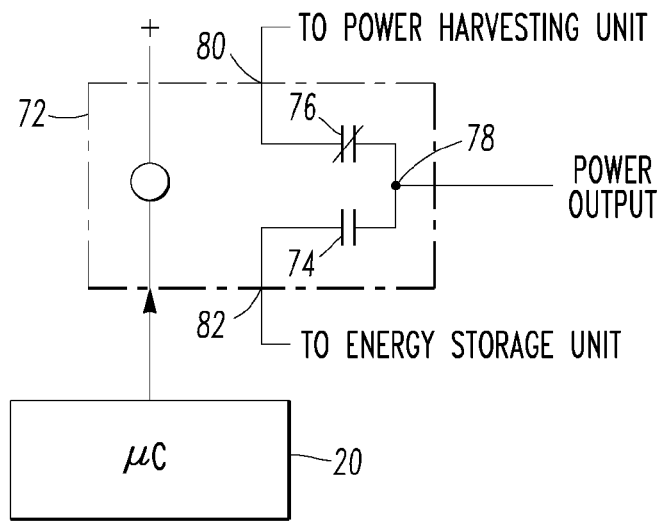

The selector 16 may be, for example, an electromagnetic device, such as a relay 72 with form C contacts (i.e., a normally open contact 74, a normally closed contact 76 and a common terminal 78) as shown in FIG. 4. For example, the power harvesting unit 22 (FIG. 1) is electrically connected to the transient suppressor 26 (FIG. 1) (at the common terminal 78) through terminal 80 of the normally closed contact 76, and the energy storage unit 12 (FIG. 1) is electrically connected to the transient suppressor 26 through terminal 82 of the normally open contact 74.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. An apparatus for a power bus including a current flowing therein, said apparatus comprising:
   an inductive power harvesting unit structured to provide a first power output arising from the current flowing in said power bus;
   an energy storage unit structured to store energy from the first power output of said inductive power harvesting unit and to provide a second power output;
   a selector structured to select one of the first power output of said inductive power harvesting unit and the second power output of said energy storage unit and to provide a third power output from said selected one; and
   a processor powered from the third power output of said selector,
   wherein said selector is further structured to normally provide the third power output from the first power output of said inductive power harvesting unit, and
   wherein said processor is structured to determine that the first power output of said inductive power harvesting unit is inadequate and to cause said selector to provide the third power output from the second power output of said energy storage unit.

2. The apparatus of claim 1 wherein said processor includes an output and wherein said energy storage unit is further structured to provide the second power output to power said processor through said selector for at least a period of time sufficient for said processor to output an alarm at the output of said processor.

3. The apparatus of claim 1 wherein said processor includes a wireless transceiver powered from the third power output of said selector.

4. The apparatus of claim 3 wherein said power bus carries current wherein said processor includes a sensor structured to sense the current of said power bus; and wherein said wireless transceiver is structured to output a wireless message including the sensed current of said power bus.

5. The apparatus of claim 3 wherein said inductive power harvesting unit is further structured to output a signal that indicates that the first power output of said inductive power harvesting unit is inadequate; wherein said processor is structured to receive said signal; and wherein said wireless transceiver is structured to output a wireless message including said signal.

6. The apparatus of claim 5 wherein said wireless message is a wireless alarm message.

7. The apparatus of claim 3 wherein said processor is further structured to determine that the second power output of said energy storage unit is inadequate and responsively send a predetermined number of wireless messages from said wireless transceiver in anticipation of lass of power from the second power output of said energy storage unit.

8. The apparatus of claim 1 wherein said processor is further structured to determine that the second power output of said energy storage unit is inadequate and responsively become inactive.

9. The apparatus of claim 8 wherein said processor is further structured to become active responsive to the first power output of said inductive power harvesting unit being adequate and to signal said selector to receive power from the first power output of said inductive power harvesting unit.

10. The apparatus of claim 1 wherein said energy storage unit comprises at least one of a capacitor, a supercapacitor, an ultracapacitor, and a rechargeable battery.

11. The apparatus of claim 1 wherein said inductive power harvesting unit is further structured to continuously charge said energy storage unit.

12. The apparatus of claim 1 wherein said selector is an electronic relay.

13. The apparatus of claim 12 wherein said electronic relay is a two pole, single throw solid state relay including a first pole inputting the first power output of said inductive power harvesting unit, a second pole inputting the second power output of said energy storage unit, and a common output outputting said third power output from said selected one.

14. The apparatus of claim 12 wherein said electronic relay includes a first FET inputting the first power output of said inductive power harvesting unit, a second FET inputting the second power output of said energy storage unit, and a common output from said first end second FETs outputting said third power output from said selected one; and wherein said processor includes a first output controlling said first PET and a second output controlling said second FET.

15. The apparatus of claim 1 wherein said selector includes a transient suppressor electrically connected between the third power output and ground.

16. The apparatus of claim 1 wherein said selector is an electromagnetic device.

17. The apparatus of claim 16 wherein said electromagnetic device is a relay including form C contacts.

18. The apparatus of claim 17 wherein said form C contacts include a normally open contact having a first terminal and a second terminal, a normally closed contact having a first terminal and a second terminal, and a common terminal electrically connected to the second terminals of said normally open contact and said normally closed contact; wherein the first terminal of said normally closed contact inputs the first power output of said inductive power harvesting unit; wherein the first terminal of said normally open contact inputs the second power output of said energy storage unit; and wherein said common terminal outputs said third power output from said selected one.

19. The apparatus of claim 1 wherein said processor includes a current sensor structured to sense the current flowing in said power bus and an output structured to output the sensed current.

20. An apparatus for a power bus including a current flowing therein, said apparatus comprising:
a sensor structured to sense the current of said power bus,
an inductive power harvesting unit structured to provide a first power output arising from the current flowing in said power bus;
an energy storage unit structured to store energy from the first power output of said inductive power harvesting unit and to provide a second power output;
a selector structured to select one of the first power output of said inductive power harvesting unit and the second power output of said energy storage unit and to provide a third power output from said selected one;
a processor powered from the third power output of said selector; and
a wireless transceiver powered from the third power output of said selector) cooperating with said processor, and structured to output a wireless message including or related to the sensed current of said power bus,
wherein said selector is further structured to normally provide the third power output from the first power output of said inductive power harvesting unit, and
wherein said processor is structured to determine that the first power output of said inductive power harvesting unit is inadequate and to cause said selector to provide the third power output from the second power output of said energy storage unit.

21. The apparatus of claim 20 wherein said processor is further structured to determine that the second power output of said energy storage unit is inadequate and responsively cause said wireless transceiver to send a predetermined number of wireless messages in anticipation of loss of power from the second power output of said energy storage unit before becoming inactive.

* * * * *